(12) United States Patent
Hotta (10) Patent No.: US 10,833,011 B2
(45) Date of Patent: Nov. 10, 2020

(54) SEMICONDUCTOR DEVICE

(71) Applicant: RENESAS ELECTRONICS CORPORATION, Tokyo (JP)

(72) Inventor: Mitsuhiro Hotta, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/572,062

(22) Filed: Sep. 16, 2019

(65) Prior Publication Data

US 2020/0105659 A1    Apr. 2, 2020

(30) Foreign Application Priority Data

Oct. 1, 2018  (JP) .................................. 2018-186458

(51) Int. Cl.
| | |
|---|---|
| H01L 23/52 | (2006.01) |
| H01L 23/528 | (2006.01) |
| H01L 23/535 | (2006.01) |
| H01L 27/085 | (2006.01) |
| H01L 25/065 | (2006.01) |
| G11C 16/08 | (2006.01) |
| G11C 16/30 | (2006.01) |
| G11C 16/14 | (2006.01) |
| G11C 16/10 | (2006.01) |
| G11C 16/26 | (2006.01) |

(52) U.S. Cl.
CPC ............ H01L 23/528 (2013.01); G11C 16/08 (2013.01); G11C 16/30 (2013.01); H01L 23/535 (2013.01); H01L 25/0655 (2013.01); H01L 27/085 (2013.01); G11C 16/10 (2013.01); G11C 16/14 (2013.01); G11C 16/26 (2013.01)

(58) Field of Classification Search
None
See application file for complete search history.

(56) References Cited

U.S. PATENT DOCUMENTS

| | | | |
|---|---|---|---|
| 9,373,621 B2 | 6/2016 | Aruga et al. | |
| 2012/0142177 A1* | 6/2012 | Kim | H01L 29/78 438/585 |
| 2014/0291748 A1* | 10/2014 | Kanda | H01L 27/11517 257/316 |
| 2017/0345817 A1* | 11/2017 | Nishimura | H01L 27/0623 |

FOREIGN PATENT DOCUMENTS

JP    2010-129895 A    6/2010

* cited by examiner

*Primary Examiner* — Tan T. Nguyen
(74) *Attorney, Agent, or Firm* — McDermott Will & Emery LLP

(57) ABSTRACT

An semiconductor device capable of suppressing an increase in layout area can be provided. According to one embodiment, the semiconductor device comprises a transistor including a drain formed in a main surface portion of the semiconductor substrate, a source formed in a main surface portion, and a gate for controlling the current between the drain and the source, a drain wiring connected to the drain through the contact, and a passing wire disposed between the source wiring connected to the source through the contact and insulated from the drain, the source, and the gate.

20 Claims, 10 Drawing Sheets

SEMICONDUCTOR DEVICE

CROSS-REFERENCE TO RELATED APPLICATIONS

The disclosure of Japanese Patent Application No. 2018-186458 filed on Oct. 1, 2018 including the specification, drawings and abstract is incorporated herein by reference in its entirety.

BACKGROUND

The present disclosure relates to a semiconductor device, and more particularly, to a semiconductor device having a transistor and a wire formed around the transistor.

Wires around transistors formed on a semiconductor substrate are generally formed in regions between adjacent transistors or in conductive layers above the transistors. In recent years, as Semiconductor device chips have been reduced in size, interconnection pitches have been reduced in size.

SUMMARY

Figure 10:
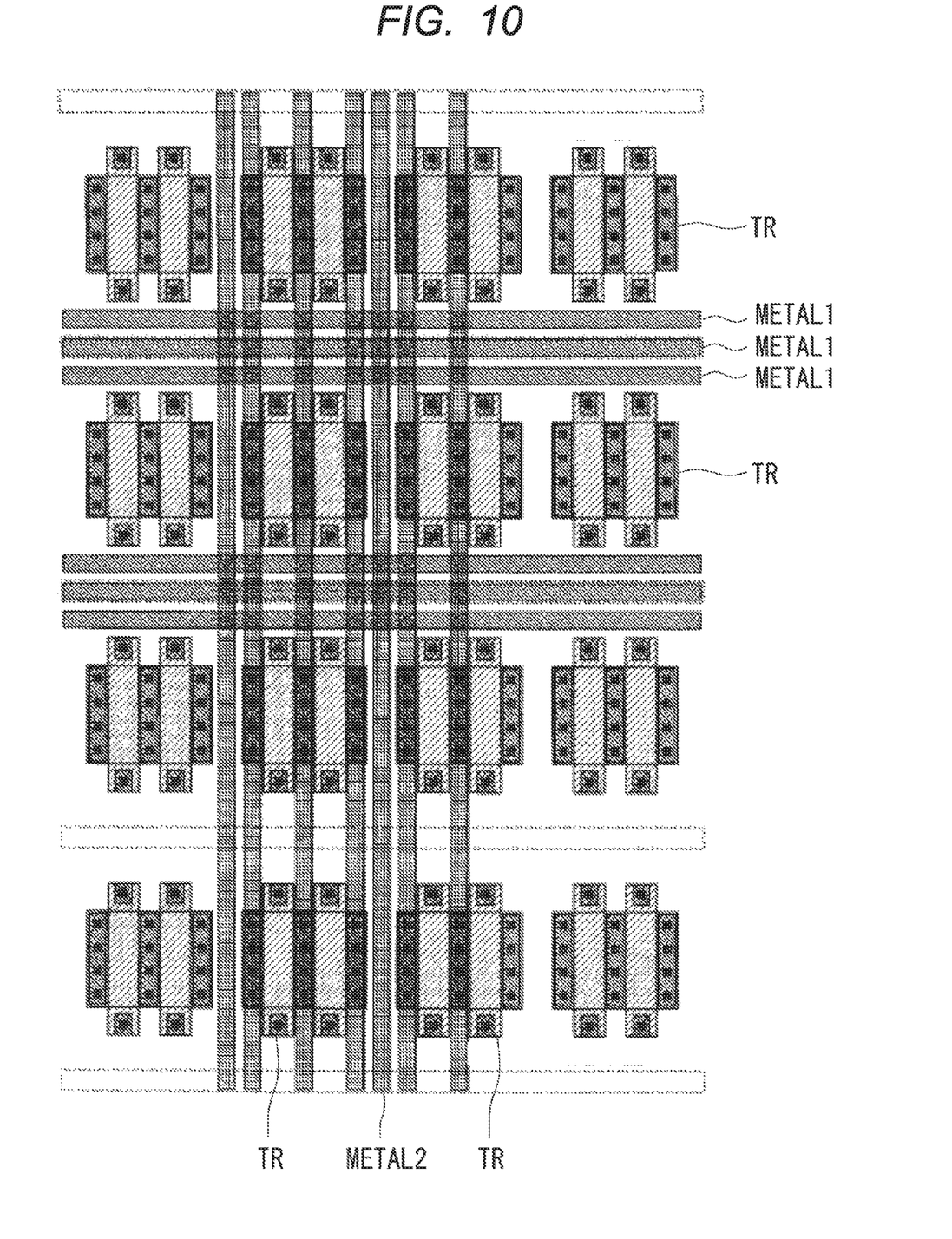
FIG. 10 is a plan view illustrating a semiconductor device of the related art.

As shown in FIG. 10, in the semiconductor device of the related art described in Japanese unexamined Patent Application publication No. 2010/129895, the wiring METAL1 and wiring METAL2 around the transistor TRs are arranged laterally and direction between the adjacent transistor TRs. Since the transistor TR does not pass through the upper wiring layer, the distance between the transistors TR increases as the number of wirings METAL1 and METAL2 increases. Therefore, the layout area is increased. In addition, when the transistor TR is passed through the upper wiring layer, the arrangement pattern of the upper wiring layer is restricted, and the degree of freedom of the wiring layer is reduced.

Other objects and novel features will become apparent from the description of this specification and the accompanying drawings.

According to an embodiment, the semiconductor device includes a transistor including a first diffusion layer formed on a main surface side portion of a semiconductor substrate, a second diffusion layer formed on the main surface side portion of the semiconductor substrate, a gate for controlling a current between the first diffusion layer and the second diffusion layer, a first wiring connected to the first diffusion layer through a first contact, and a second wiring connected to the second diffusion layer through a second contact, and a a passing wire insulated from the first diffusion layer, the second diffusion layer, and the gate.

According to the above embodiment, it is possible to provide a semiconductor device capable of suppressing an increase in layout area.

DETAILED DESCRIPTION

For clarity of explanation, the following description and drawings are appropriately omitted and simplified. In the drawings, the same elements are denoted by the same reference numerals, and a repetitive description thereof is omitted as necessary.

Figure 1:
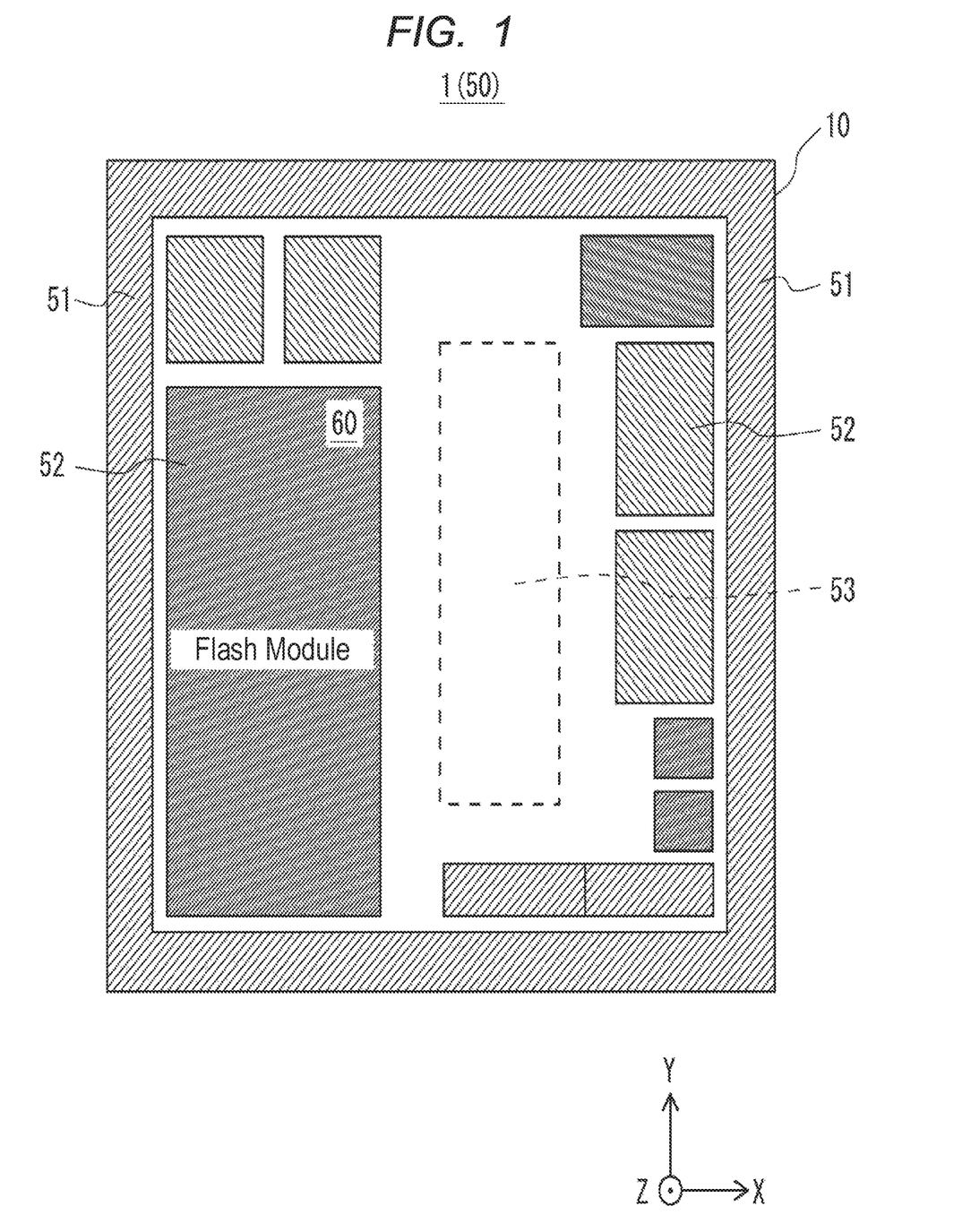
FIG. 1 is a plan view illustrating a semiconductor device according to a first embodiment.

A semiconductor device according to Embodiment 1 will be described. FIG. 1 is a plan view illustrating a semiconductor device according to a first embodiment; As shown in FIG. 1, the semiconductor device 1 is formed on a semiconductor substrate 10. The semiconductor device 1 is, for example, plate-shaped and has a rectangular main surface. The semiconductor device 1 is, for example, a semiconductor chip 50 such as a microcomputer on which a Flash module 60 or a high withstand voltage device (not shown) is mounted. The semiconductor device 1 is not limited to a semiconductor chip 50, such as a flash module 60 or a microcomputer equipped with a high-voltage withstand element, provided that the semiconductor chip includes a transistor and a passing wire described later.

Here, for convenience of explanation of semiconductor device 1, an X-Y-Z rectangular coordinate axis system will be introduced. In a plane parallel to the main surface, two orthogonal directions are set in the X-axis direction and the Y-axis direction. The direction orthogonal to the main surface is defined as the Z-axis direction. In the Z-axis direction, the direction from the back surface on the opposite side of the main surface to the main surface is defined as the +Z-axis direction.

An I/O region 51, a hard macro region 52, and a soft macro region 53 are formed on the main surface of the semiconductor device 1. The I/O region 51 is formed in the peripheral portion of the main surface along the peripheral edge of the main surface. In the I/O area 51, input/output circuits for performing input/output between the semiconductor device 1 and the outside are arranged. The hard macro region 52 and the soft macro region 53 are formed in a central portion of the main surface, that is, in a region surrounded by the I/O region 51.

Hard macro modules such as a flush module 60, a SRAM module, and analogue circuits are formed in the hard macro area 52. The hard macro region 52 in which such a hard macro module is arranged is arranged along the I/O region 51 at a portion inside the I/O region 51.

Soft macro modules are arranged in the soft macro area 53. The soft macro module is, for example, a CPU. The soft macro module controls a hard macro module such as the flash module 60. The soft macro region 53 is arranged at the center of the hard macro region 52, and the hard macro region 52 is surrounded by the I/O region 51. Therefore, the hard macro region 52 is disposed between the I/O region 51 and the soft macro region 53. For example, when viewed from the flash module 60 in the hard macro region 52, the I/O region 51 is formed on the −X-axis direction side of the flash module 60, and the soft macro region 53 is formed on the +X-axis direction side of the flash module 60. Several hundred signal wirings are formed between the flash module 60 and the soft macro module, and signals are exchanged between them.

The flash module 60 occupies a large part of the main surface of the semiconductor device 1 such as a microcomputer in which the flash module 60 is mounted. Therefore, in order to connect with the soft macro region 53 with the minimum necessary wiring, the flash module 60 is often disposed closer to the I/O region 51. As a result, the signal terminals of the flash module 60 are concentrated on the soft macro region 53 side, and the chip size can be reduced while the wiring performance is improved.

Figure 2:
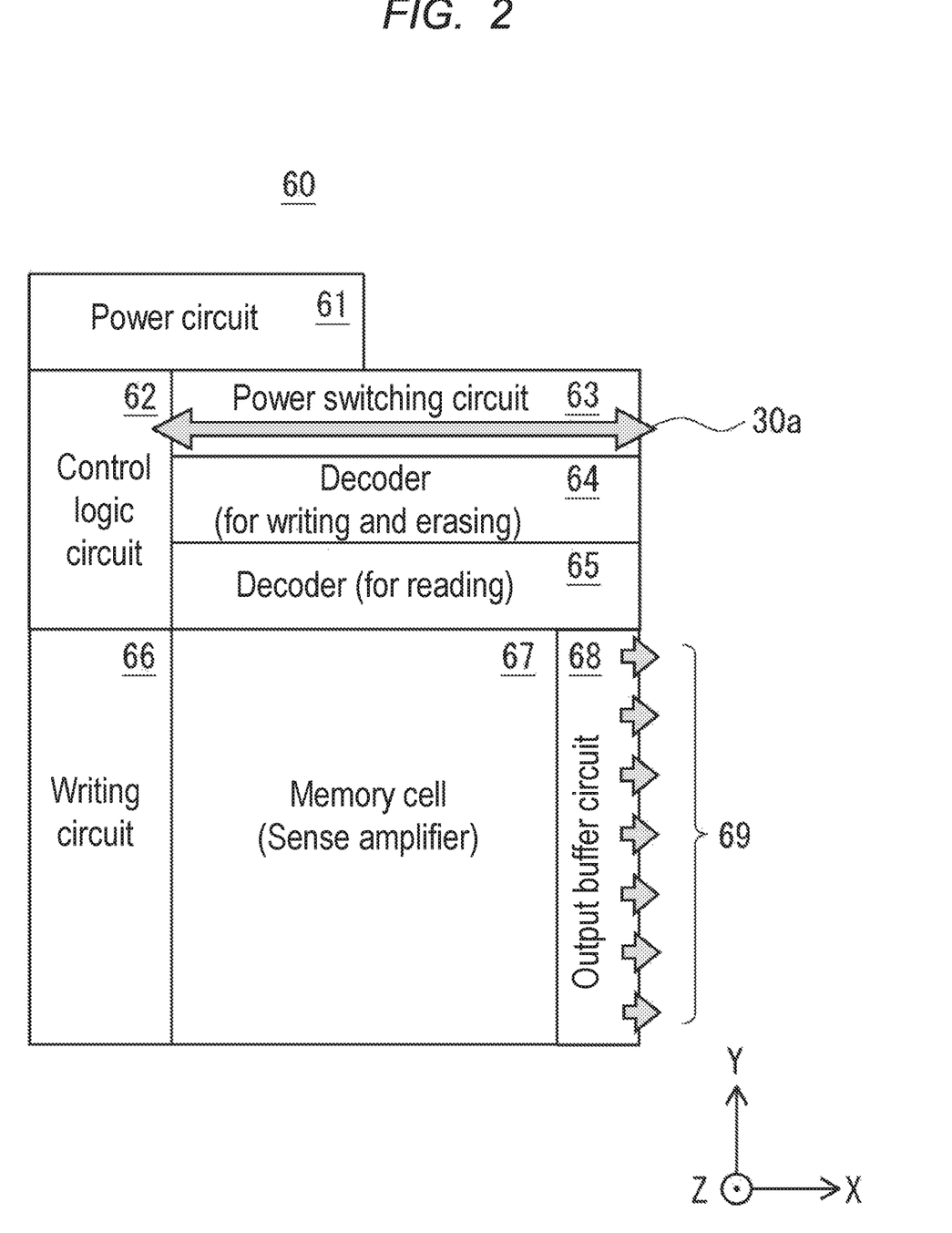
FIG. 2 is a configuration diagram illustrating a flash module of a semiconductor device according to a first embodiment.

FIG. 2 is a configuration diagram illustrating the flush module 60 of the semiconductor device 1 according to the first embodiment. As shown in FIG. 2, the flash module 60 includes a Power circuit 61, a control logic circuit 62, a power switching circuit 63, a decoder 64 for writing and erasing, a decoder 65 for reading, a writing circuit 66, a memory cell 67, and an output buffer circuit 68.

The power circuit 61 supplies power for the flush module 60. The control logic circuit 62 controls the decoder of the flash module 60, and controls writing, reading, and the like of the memory cell 67. The power switching circuit 63 controls turning on and off of a power source used in the flash module 60. The decoder 64 for writing and erasing, the decoder 65 for reading, and the writing circuit 66 write to and read from the memory cell 67. The memory cell 67 includes a plurality of storage elements. When a signal is read from the memory cell 67, the signal is amplified by sense amplifier. Therefore, the memory cell 67 includes the sense amplifier. The output buffer circuit 68 outputs data retrieved from the memory cell 67.

A power circuit 61, a control logic circuit 62, and a writing circuit 66 are disposed in the-X-axis direction of the flash module 60. An output buffer circuit 68 is disposed in the +X-axis section of the flush module 60. The output buffer circuit 68 has a signal terminal 69. The signal terminal 69 is formed on a side of the flash module 60 on the +X-axis direction side. A soft macro region 53 and a hard macro region 52 are formed on the +X-axis direction side of the flash module 60. Thus, the signal terminal 69 enables transmission and reception of signals between the flash module 60 and the soft macro module and other hard macro modules.

Although it is possible to arrange the signal terminal 69 on a side other than the +X-axis direction side of the flash module 60, in this case, it is necessary to arrange a wiring region from the side on which the signal terminal 69 is arranged to the soft macro region 53 at the center of the main surface. This leads to an increase in the layout area on the main surface of the semiconductor device 1. Therefore, it is desirable to arrange the signal terminal 69 on the soft macro region 53 and the hard macro region 52 side.

However, as shown in FIG. 2, even if the signal terminal 69 is disposed on the side of the flash module 60 on the soft macro region 53 side, the wiring 30 *a* passing through the inside of the flash module 60 is necessary. The flash module 60 includes various circuits as described above. For example, since the Control logic circuit 62 is disposed in the-X-axis direction-side part of the flash module 60, the wire 30 *a* passing through the inside of the flash module 60 is required for transmission and reception of signals between the Control logic circuit 62 and the soft macro area 53.

The arrangement of the various circuits in the flash module is designed in consideration of high-speed processing and large storage capacity. The control logic circuit 62 is disposed on the I/O area 51 side of the flash module 60, and the decoder 64, 65 and the power switching circuit 63 are disposed on the soft macro area 53 side of the control logic circuit 62, which is suitable for high-speed operation and large-capacity operation of the flash module 60. Therefore, the wires 30 *a* passing through the inside of the power switching circuit 63 are required for transmission and reception of signals between the control logic circuit 62 and the soft macro module.

In such cases, it is common to form the interconnection 30 *a* between adjacent transistors in the power switching circuit 63 or in a conductive layer above the power switching circuit 63. However, in the present embodiment, the passing wire is disposed using the first conductive layer from the main surface of the power switching circuit 63.

Figure 3:
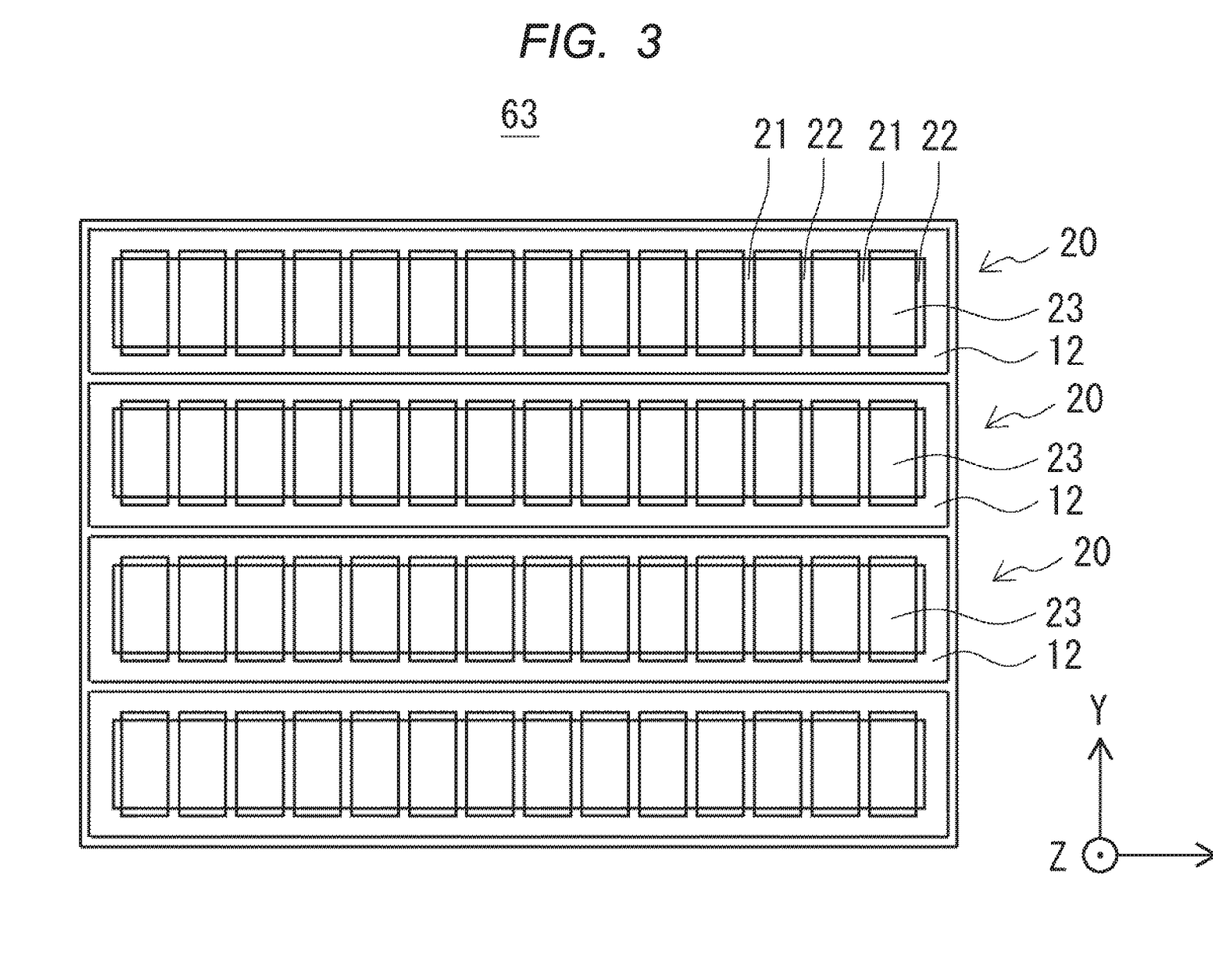
FIG. 3 is a plan view illustrating a power switching circuit of a semiconductor device according to a first embodiment.

FIG. 3 is a plan view illustrating the power switching circuit 63 of the semiconductor device 1 according to the first embodiment. As shown in FIG. 3, the power switching circuit 63 includes a plurality of diffused layers 12 for supplying power to the well and a plurality of transistors 20. In FIG. 3, only a part of the diffusion layer 12 and the transistor 20 are denoted by reference numerals so as not to complicate the drawing. Actually, in the power switching circuit 63, a plurality of diffusion layers 12 are arranged in the Y-axis direction, and a plurality of transistors 20 are arranged in the X-axis direction in the diffusion layers 12. In other subsequent drawings, some reference numerals may be omitted so that the drawings are not complicated.

Transistor 20 includes a drain 21, a source 22, and a gate 23. The Power switching circuit 63 includes the transistor 20 for switching the power supply of the flash module 60. The transistor 20 is, for example, a MOS transistor.

In order to reduce the on-resistance of the transistor 20 of the power switching circuit 63, the width W, i.e., the length in the Y-axis direction, is increased. Specifically, the drain 21, the source 22, and the gate 23 extend in the Y-axis direction. The power supply of the hard macro module and the soft macro module other than the flash module 60 is about 1 V, whereas the power supply for the flash module 60 handled by the power switching circuit 63 is 10 V or higher. Therefore, the gate length of the transistor 20 is also increased in order to secure the breakdown voltage of the transistor 20.

Incidentally, in recent advanced processes, layout constraints have become strict due to fine processing in manufacturing. In order to ensure restrictions on the maximum gate area and maximum gate densities of the transistors 20, the transistors 20 used in the Power switching circuit 63 may be divided and arrayed. Using such a configuration of the power switching circuit 63, a wire passing through the inside of the power switching circuit 63 is formed.

Figure 4:
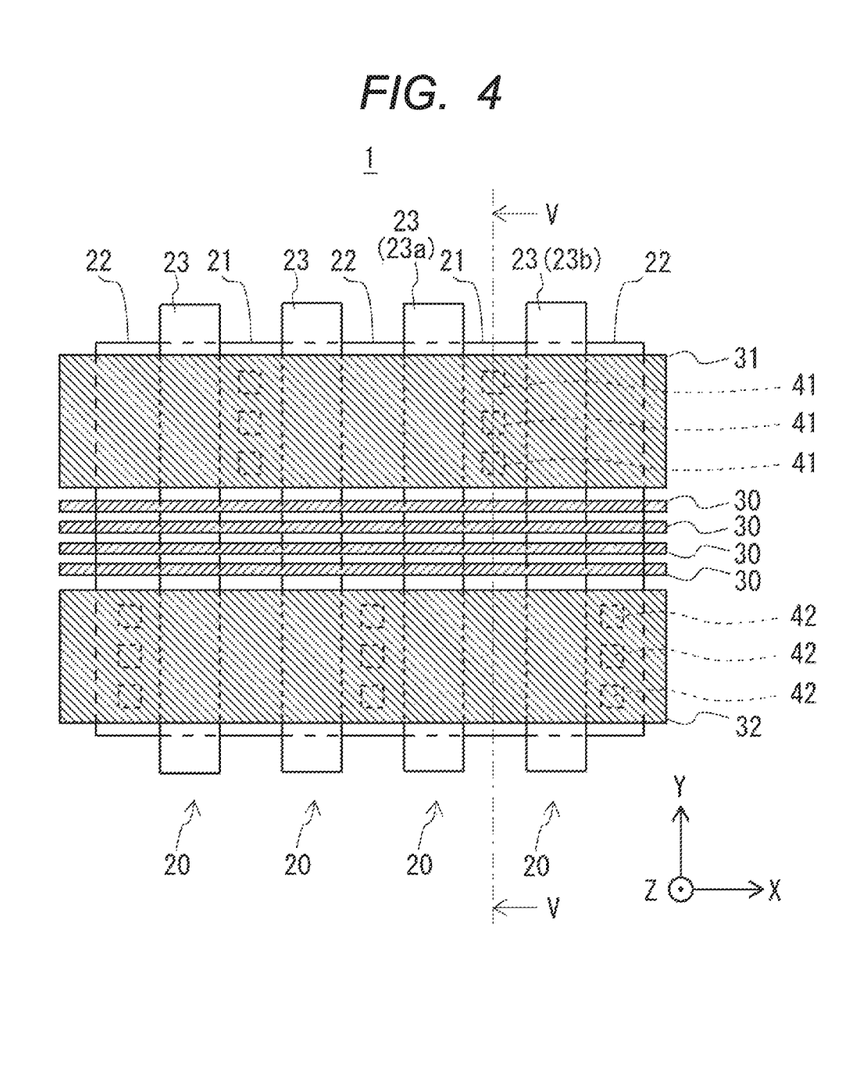
FIG. 4 is a plan view illustrating a transistor and a a passing wire of a semiconductor device according to a first embodiment.
Figure 5:
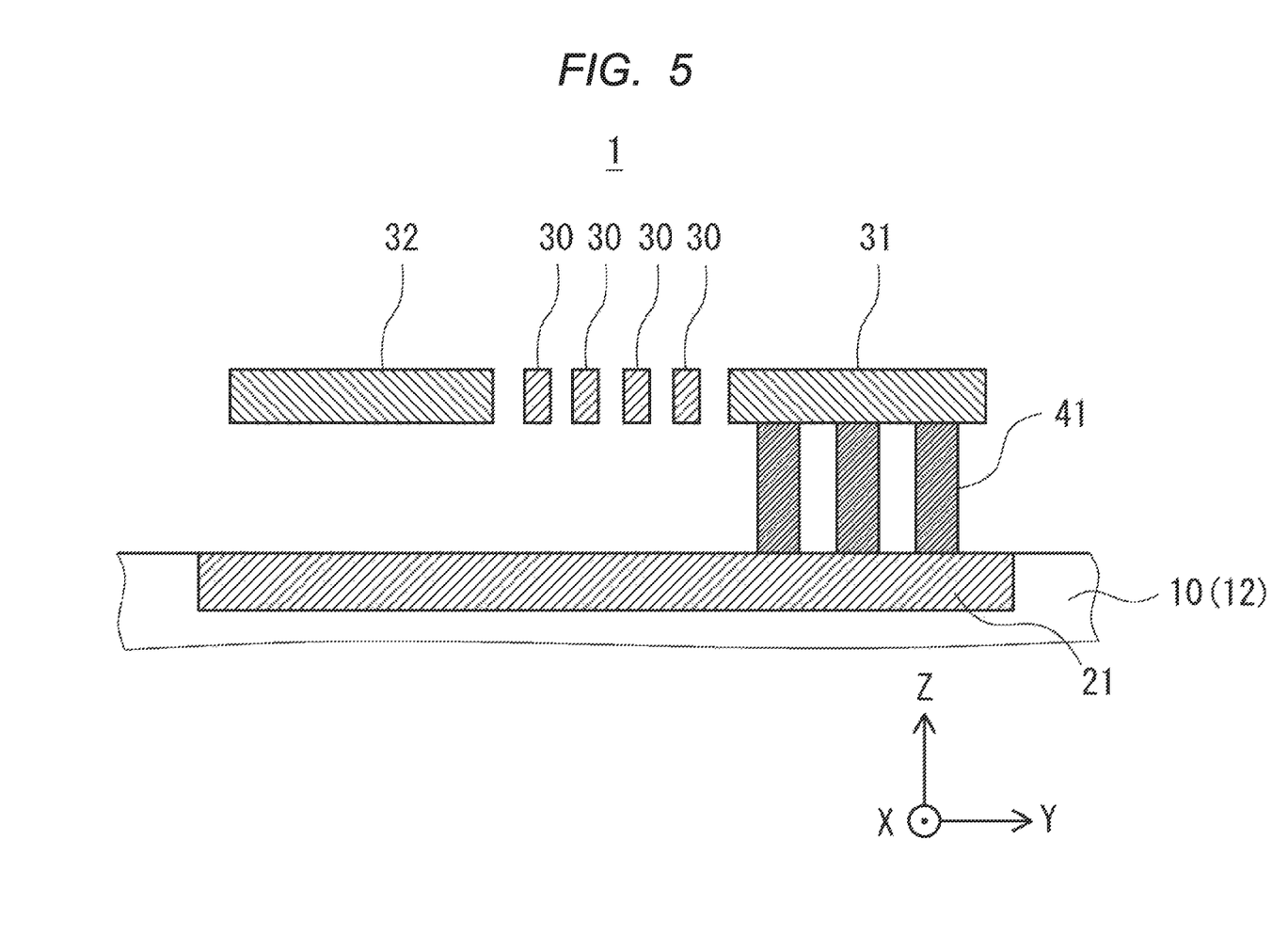
FIG. 5 is a cross-sectional view illustrating a transistor and a passing wire of the semiconductor device according to the first embodiment, and shows a cross-sectional view taken along the line V-V in FIG. 4.

FIG. 4 is a plan view illustrating a transistor and a passing wire of the Semiconductor device according to the first embodiment. FIG. 5 is a cross-sectional view illustrating a transistor and a passing wire of the semiconductor device according to the first embodiment, and shows a cross-sectional view taken along the line V-V of FIG. 4. In order not to complicate the drawing, some hatching is omitted. As shown in FIG. 4 and FIG. 5, the semiconductor device 1 includes a transistor 20 and a passing wire 30. Transistor 20 in semiconductor device 1 is, for example, a power switch in power switching circuit 63.

The transistor 20 is formed on the main surface side of the semiconductor substrate 10. The transistor 20 includes a diffusion layer serving as a drain 21, a diffusion layer serving as a source 22, and a gate 23. The gate 23 controls the current between the drain 21 and the source 22. The gate 23 is formed, for example, on the semiconductor substrate 10. The gate 23 extends in one direction in a plane parallel to the main surface of the semiconductor substrate 10. For example, it extends in the Y-axis direction. The one direction in which the gate 23 extends is the width direction of the transistor. In this case, the gate length direction is the X-axis direction. A plurality of gates 23 may be formed. The plurality of gates 23 are arranged side by side in the gate length direction.

The drain 21 and the source 22 extend in the same one direction as the gate 23, that is, in the Y-axis direction. The drain 21 and the source 22 are formed on both sides of the gate 23. Specifically, the drain 21 and the source 22 are formed in a portion on the main surface side of the semiconductor substrate 10. For example, in the plurality of gates 23, the drains 21 are formed in a portion on the main surface side on the +X-axis direction side when viewed from the gate 23a, and the sources 22 are formed in a portion on the main surface side on the −X-axis direction side. When viewed from the gate 23b arranged next to the gate 23a, the drain 21 is formed in the portion on the main surface side on the −X-axis direction side, and the source 22 is formed in the portion on the main surface side on the +X-axis direction side. Therefore, the drain 21 and the source 22 are formed alternately with the drain 21, the source 22, the drain 21, the source 22, . . . between the plurality of gates 23 arranged at intervals in the X-axis direction.

A drain wiring 31 and a source wiring 32 are formed on the semiconductor substrate 10 and the gates 23. The drain wiring 31 and the source wiring 32 extend in the other direction intersecting with the extending direction of the gate 23 in a plane parallel to the main surface, that is, in the gate length direction. Specifically, the drain wiring 31 and the source wiring 32 extend in the X-axis directions. The drain wiring 31 and the source wiring 32 are spaced apart from each other in the Y-axis direction.

The drain wiring 31 is connected to the drain 21 via a contact 41. The contact 41 is formed, for example, in a through hole provided in an insulating layer (not shown) on the drain 21. The drain wiring 31 is formed on the insulating layer. The contact 41 is disposed at the intersection of the drain 21 extending in the Y-axis direction and the drain wiring 31 extending in the X-axis direction.

The source wiring 32 is connected to the sources 22 via contacts 42. The contact 42 is formed, for example, in a through hole provided in an insulating layer (not shown) on the source 22. The source wiring 32 is formed on the insulating layer. Contacts 42 are located at the intersection of sources 22 and source wiring 32.

The drain wiring 31 and the source wiring 32 belong to the first conductive layer in the +Z-axis directions from the main surface of the semiconductor substrate 10. For example, an insulating layer (not shown) is formed on the semiconductor substrate 10, and the contacts 41 and 42 are formed in the through holes. Thereafter, a first conductive layer is formed over the insulating layer. The drain wiring 31 and the source wiring 32 may be formed by patterning the conductive layers. In this instance, the drain wiring 31 and the source wiring 32 are approximately the same distances from the main surface of the semiconductor substrate 10.

The passing wire 30 is disposed between the drain wiring 31 and the source wiring 32. A plurality of a passing wire 30 may be arranged. The passing wire 30 extends in the other direction crossing the extending direction of the gates 23, that is, in the X-axis direction. Like the drain wiring 31 and the source wiring 32, the passing wire 30 belongs to the first conductive layer in the +Z-axis directions from the main surface of the semiconductor substrate 10. Thus, the passing wire 30, like the drain wiring 31 and the source wiring 32, is approximately the same distance from the main surface of the semiconductor substrate 10.

When the plurality of gates 23 are arranged side by side in the gate length direction, that is, in the X-axis direction, a plurality of transistors 20 adjacent to each other in the gate length direction are arranged. The drain wiring 31 and the source wiring 32 are connected to the drains 21 and the sources 22 of the plurality of transistors 20.

The passing wire 30 is insulated from the drain wiring 31, the source wiring 32, and the gates 23. The passing wire 30 is not connected to the drain wiring 31 and the source wiring 32, nor is it connected to the gate 23 and the gate wiring connected to the gate 23. Therefore, a passing wire 30 is not electrically connected to the transistor 20.

The passing wire 30 is connected to modules other than the Power switching circuit 63 including the transistor 20. The passing wire 30 connects, for example, the Control logic circuit and the soft macro module. The passing wire 30 transmits digital signals between the control logic circuit 62 and the CPUs, for example. The passing wire 30 may transmit analogue signals. The passing wire 30 may then be shielded.

The operating voltage VT of the transistor 20 may be different from the operating voltage VM of the modules to which the passing wire 30 is connected. For example, the operating voltage VT may be higher than the operating voltage VM, or the operating voltage VT may be a negative voltage with respect to the operating voltage VM. When the operation voltage VT is higher than the operating voltage VM and when the operating voltage VM is a negative voltage with respect to the operating voltage VM, the transistor 20 is large, so that the passing wire 30 can be spaced apart.

Next, the operation of the Semiconductor device 1 of the present embodiment will be described. The transistor 20 in the Power switching circuit 63 controls, for example, turning on and off of power to the flash module 60. For example, the voltage at the gate 23 of the transistor 20 is controlled to control the conduction between the drain 21 and the source 22. Thus, supply and stop of power to the flash module 60 are controlled.

The transistor 20 in the Power switching circuit 63 is larger than the elements such as transistors included in other hard macro modules and soft macro modules. While the wiring pitch has been reduced, the size of a high withstand voltage element such as a power switch used in the flash module 60 has not been reduced to handle a high voltage. In the present embodiment, the passing wire 30 is formed using the first conductive layer of the transistor 20, which is relatively large in size. Specifically, the passing wire 30 connecting the control logic circuit 62 and the soft macro module passes between the drain wiring 31 and the source wiring 32. The passing wire 30 transmits signals between the control logic circuit 62 and the soft macro module.

Next, effects of the present embodiment will be described. In this embodiment, the a passing wire 30 insulated from the drain 21, the source 22 and the gate 23 of the transistor 20 is disposed between the drain wiring 31 and the source wiring 32 connected to the source 22 and the gate 23 via the contacts 41 and 42. Therefore, it is unnecessary to form a wiring region between the adjacent transistors 20, and the wiring region occupying the main surface of the Semiconductor device 1 can be reduced.

In addition, in order to handle a high voltage or a negative voltage, attention is paid to the Power switching circuit 63 which is larger than other devices, and the a passing wire 30 is formed in the lowermost conductive layer of the transistor 20 in the Power switching circuit 63 which has not been used so far. Therefore, the transistor 20 can be left as it is, and the space of the passing wire 30 can be ensured. As a result, an increase in the layout area can be suppressed.

Further, the larger the size of the transistor 20, the larger the space of the passing wire 30 can be ensured, so that the increase in the wiring area can be suppressed. On the other hand, for smaller-sized transistors, it is difficult to use the resources of the first conductive layer only by forming the contacts and to secure the spaces of the passing wire 30.

The drain wiring 31, the source wiring 32, and the passing wire 30 passing therebetween extend along the length of the gates. Therefore, the passing wire 30 can be formed in the lowest conductive layer to which the drain wiring 31 and the source wiring 32 belong, and the interconnection area can be suppressed from increasing. In addition, the degree of freedom of layout can be improved with respect to the conductive layer formed in the upper layer of the second layer or more of the transistor 20.

A plurality of transistors 20 are provided, and the drain 21 and the source 22 of each transistor 20 are shared. Therefore, reliability can be improved when the voltage of the transistor 20 is increased.

Figure 6:
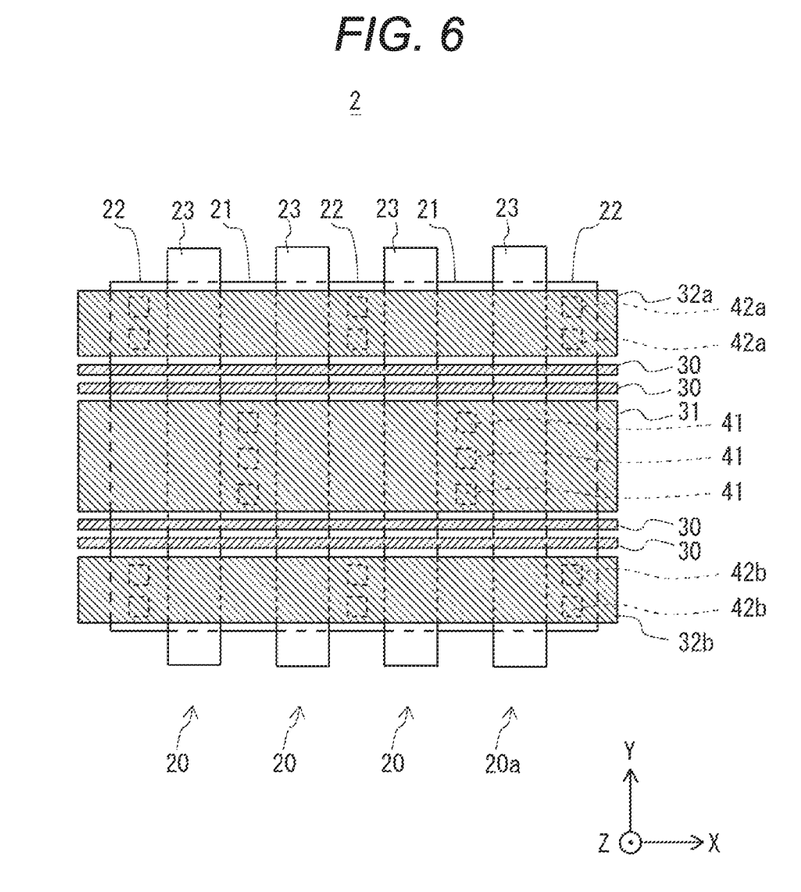
FIG. 6 is a plan view illustrating a transistor and a a passing wire of a semiconductor device according to the second embodiment.

Next, Embodiment 2 will be described. In the present embodiment, the source wiring is divided and wired in the Y-axis direction which is the widthwise direction of the transistor 20. FIG. 6 is a plan view illustrating a transistor and a passing wire of the Semiconductor device according to the second embodiment.

As shown in FIG. 6, in the Semiconductor device 2 of the present embodiment, a plurality of source wiring are provided. A plurality of source wiring 32a and 32b are connected to the sources 22 of the same transistor 20. For example, the source 22 of the transistor 20a is connected to the source wiring 32a via a contact 42a and to the source wiring 32b via a contact 42b. The drain wiring 31 is disposed between a plurality of source wiring 32a and 32b. The passing wire 30 is disposed between the drain wiring 31 and the source wiring 32a, and between the drain wiring 31 and the source wiring 32b. A plurality of a passing wire 30 may be disposed.

According to the Semiconductor device 2 of the present embodiment, the contacts 42a and 42b between the sources 22 and the source wiring 32a and the 32b can be divided and arranged in two places in the Y-axis direction. Therefore, the diffusion layer resistance can be reduced. In particular, when the width direction of the transistor 20 is large, the effect of reducing the diffusion layer resistance can be made remarkable. Other configurations and effects are included in the description of embodiment 1.

Figure 7:
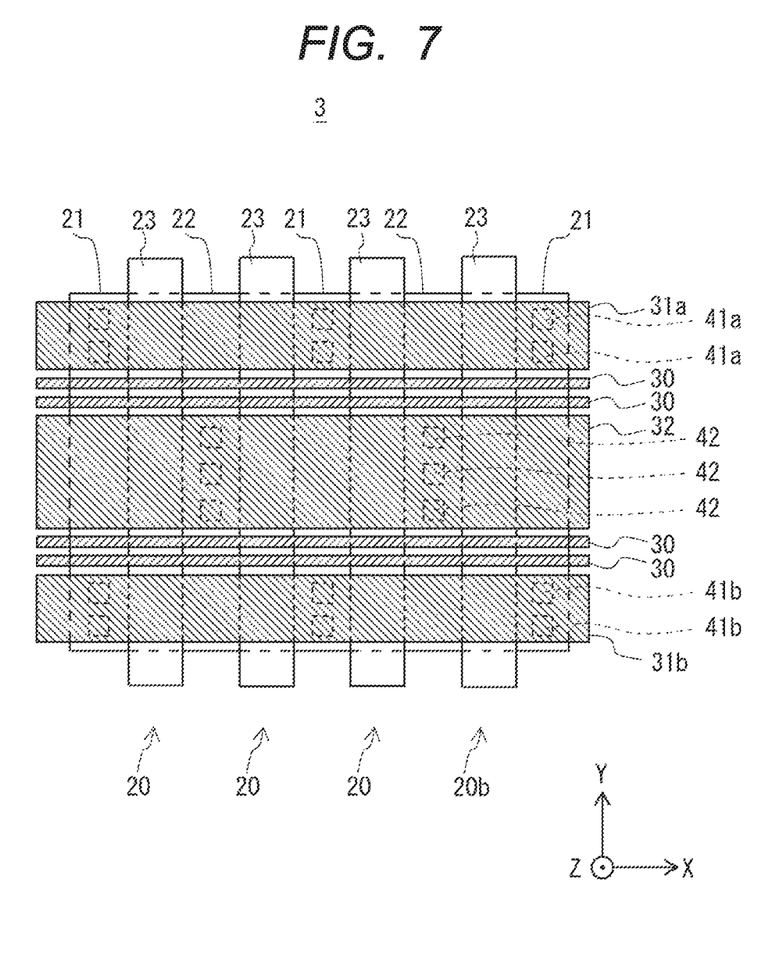
FIG. 7 is a plan view illustrating a transistor and a a passing wire of the semiconductor device according to the third embodiment.

Next, embodiment 3 will be described. In the present embodiment, the drain wiring is divided and arranged in the Y-axis direction which is the widthwise direction of the transistor 20. FIG. 7 is a plan view illustrating a transistor and a passing wire of the semiconductor device according to the third embodiment 3.

As shown in FIG. 7, in the semiconductor device 3 of the present embodiment, a plurality of drain wiring are provided. A plurality of drain wiring's 31a and 31b are connected to the drains 21 of the same transistor 20. For example, a drain wiring 31a is connected to the drain 21 of the transistor 20b via a contact 41a, and a drain wiring 31b is connected via a contact 41b. The source wiring 32 is disposed between a plurality of drain wiring 31 a and 31 b. The passing wire 30 is disposed between the source wiring 32 and the drain wiring 31a, and between the source wiring 32 and the drain wiring 31b. A plurality of a passing wire 30 may be disposed.

According to the Semiconductor device 3 of the present embodiment, the contacts 41a and 41b between the drains 21 and the drain wiring 31a and 31b can be divided and arranged at two locations in the Y-axis direction. Therefore, the diffusion layer resistance can be reduced. In particular, when the width direction of the transistor 20 is large, the effect of reducing the diffusion layer resistance can be made remarkable. Other configurations and effects are included in the description of Embodiments 1 and 2.

Figure 8:
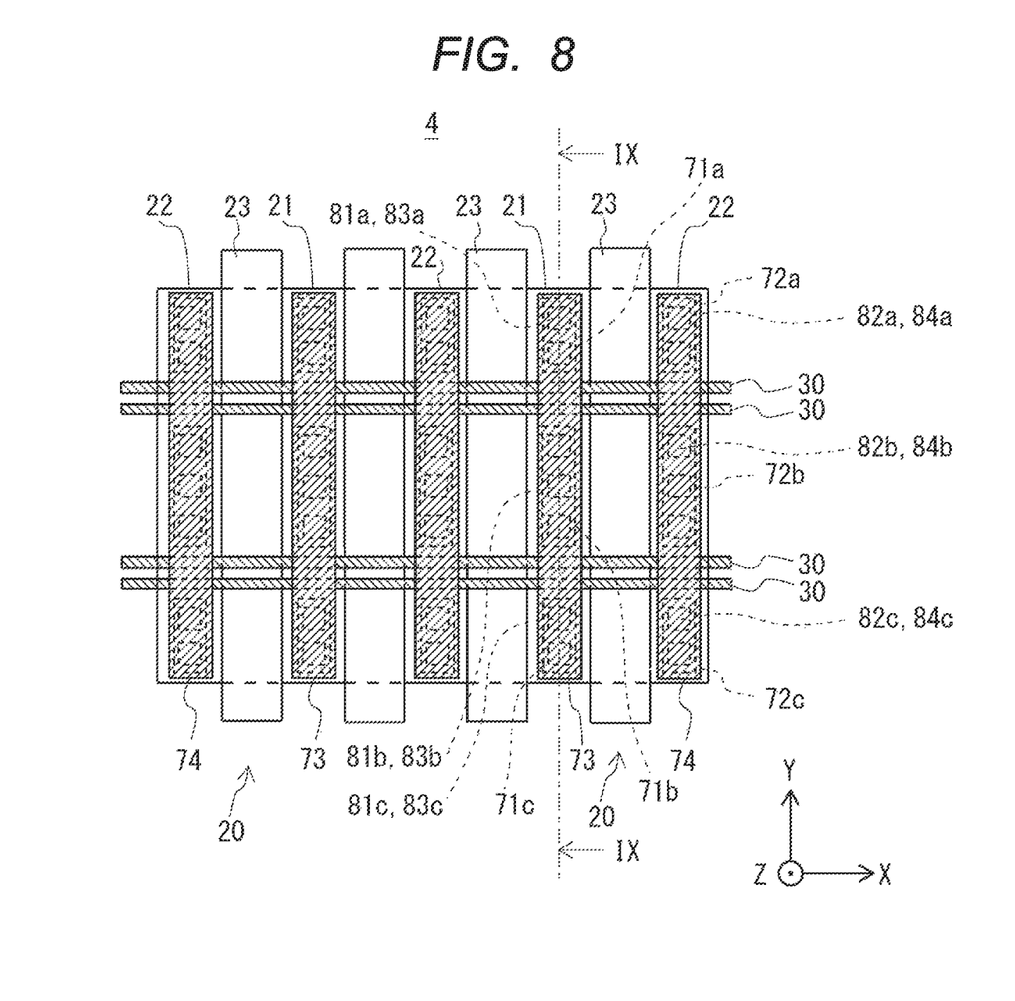
FIG. 8 is a plan view illustrating a transistor and a a passing wire of the semiconductor device according to the fourth embodiment.
Figure 9:
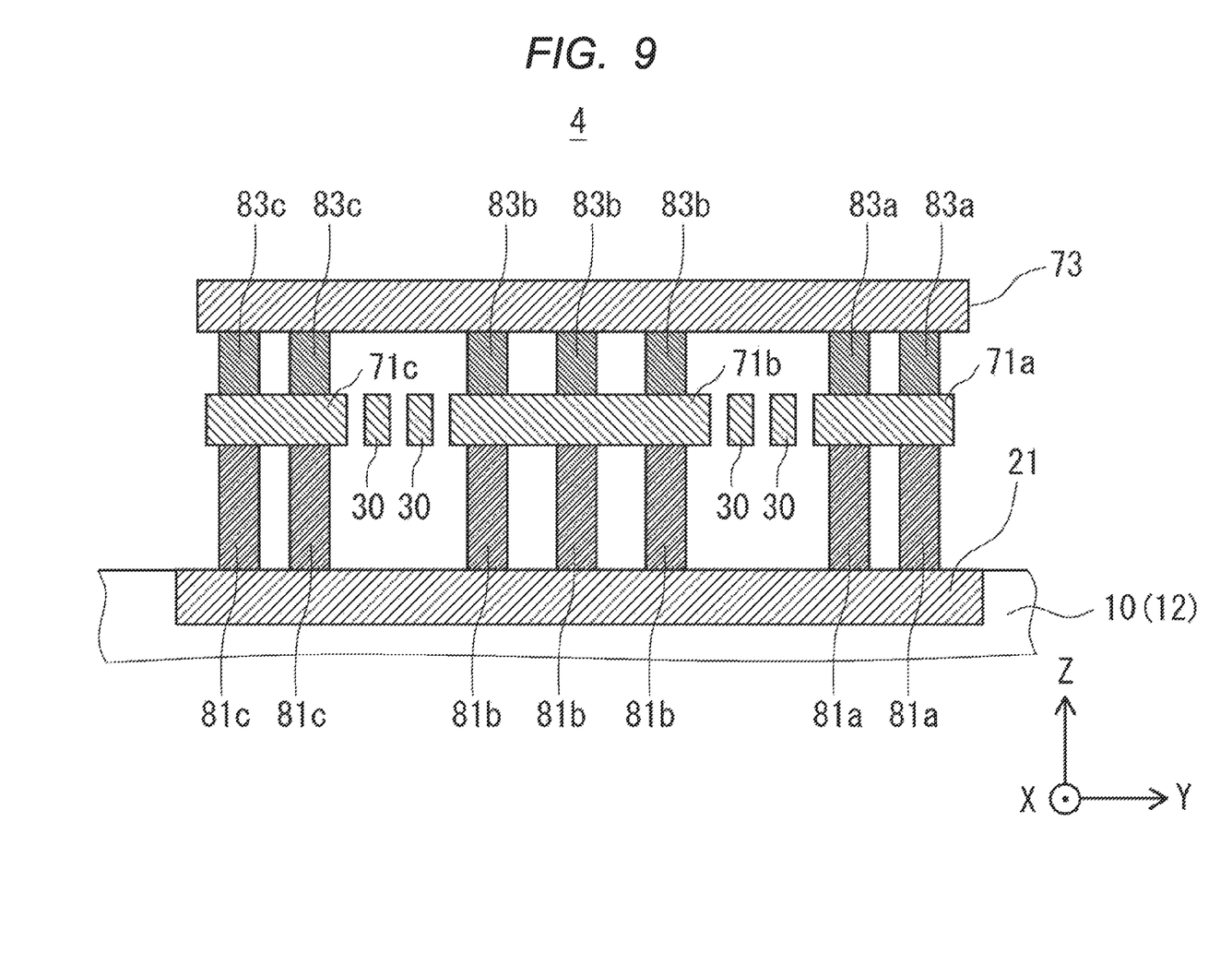
FIG. 9 is a cross-sectional view illustrating a transistor and a passing wire of the semiconductor device according to embodiment 4, showing a cross-section in the IX-IX line of FIG. 8.

Next, embodiment 4 will be described. In the present embodiment, the drain wiring 31 and the source wiring 32 do not extend in the gate-length direction, that is, in the X-axis direction. Then, a wiring of the second layer connected to the drain wiring 31 via a contact and a wiring of the second layer connected to the source wiring 32 via a contact are formed.

FIG. 8 is a plan view illustrating a transistor and a passing wire of the semiconductor device according to the fourth embodiment. FIG. 9 is a cross-sectional view illustrating a transistor and a a passing wire of the semiconductor device according to the fourth embodiment, and shows a cross-sectional view taken along a IX-IX line in FIG. 8. As shown in FIG. 8 and FIG. 9, the semiconductor device 4 includes a transistor 20 and a passing wire 30, the transistor 20 includes a drain 21, a source 22, and a gate 23, and the drain 21, the source 22, and the gate 23 extend in the Y-axis directions in the same manner as in embodiments 1 to 3.

In this embodiment, the drain wiring includes a plurality of drain wiring 71a's, 71b's and 71c's. The drain wiring 71a, the 71b, and the 71c are arranged on the drains 21 at intervals in the Y-axis direction when viewed from the +Z-axis direction. The drain wiring 71a is connected to the drain 21 via a contact 81a. The drain wiring 71b is likewise connected to the drain 21 via a contact 81b. The drain wiring 71c is likewise connected to the drain 21 via a contact 81c. In this manner, a plurality of drain wiring 71a, 71b and 71c are connected to the drains 21.

The source wiring includes a plurality of source wiring 72a, 72b and 72c. The source wiring 72a, the 72b, and the 72c are arranged on the sources 22 at intervals in the Y-axis direction when viewed from the +Z-axis direction. The source wiring 72a is connected to sources 22 via contacts 82a. The source wiring 72b is also connected to sources 22 via contacts 82b. The source wiring 72c is also connected to sources 22 via contacts 82c. Thus, the sources 22 are connected to a plurality of source wiring 72a, 72b and 72c.

The drain wiring 71a, the 71b, and the 71c, and the source wiring 72a, the 72b, and the 72c belong to the first conductive layer in the +Z-axis directions from the main surface of the semiconductor substrate 10.

The semiconductor device 4 of the present embodiment further includes a third wiring 73 and a fourth wiring 74. The third interconnection 73 is connected to the drain wiring 71a via the contact 83a. The third interconnection 73 is connected to the drain wiring 71b via the contact 83b and to the drain wiring 71c via the contact 83c. Therefore, the drain wiring 71a, the 71b, and the 71c are connected to the third interconnection 73 via the contacts 83a, 83b, and 83c, respectively. The contacts 83a, 83b, and 83c are formed in, for example, through holes provided in an insulating layer (not shown) on the first conductive layer.

The fourth interconnection 74 is connected to the source wiring 72a via a contact 84a. The fourth interconnection 74 is connected to the source wiring 72b via the contact 84b and to the source wiring 72c via the contact 84c. Therefore, the source wiring 72a, 72b, and 72c are connected to the fourth interconnection 74 through the contacts 84a, 84b, and 84c, respectively. The contacts 84a, 84b, and 84c are formed in, for example, through holes provided in an insulating layer (not shown) on the first conductive layer.

The third wiring 73 and the fourth wiring 74 belong to the second conductive layer counting in the +Z-axis direction from the main surface side of the semiconductor substrate 10. For example, an insulating film is formed on the first conductive layer, and contacts 83a, 83b, 83c, 84a, 84b, and 84c are formed in the through holes. After that, a second conductive layer is formed over the insulating layer. The third wiring 73 and the fourth wiring 74 may be formed by patterning the conductive layer.

In this case, the third wiring 73 and the fourth wiring 74 are separated from the main surface of the semiconductor substrate 10 by substantially the same distance. The third wiring 73 and the fourth wiring 74 extend in the Y-axis direction.

The passing wire 30 is disposed, for example, between drain wiring 71a and source wiring 72b. The passing wire 30 is disposed between the drain wiring 71b and the source wiring 72c.

The passing wire 30 is disposed between a plurality of drain wiring 71a, 71b and 71. For example, the passing wire 30 is disposed between drain wiring 71a and drain wiring 71b, and between drain wiring 71b and drain wiring 71c. The passing wire 30 is disposed between a plurality of source wiring 72a, 72b and 72c. For example, the passing wire 30 is disposed between source wiring 72a and source wiring 72b, and between source wiring 72b and source wiring 72c.

A plurality of a passing wire 30 may be arranged. The passing wire 30 extends in the X-axis direction crossing the extending direction of the gates 23. Like the drain wiring 71a, 71b, and 71c, and the source wiring 72a, 72b, and 72c, the passing wire 30 belongs to the first conductive layer in the +Z-axis directions from the main surface of the semiconductor substrate 10.

In this embodiment, the number of contacts 81a, the number 81b, the number 81c, the number 82a, the number 82b, and the number 82c connected to the drains 21 and the sources 22 can be increased. Therefore, the diffusion layer resistance and the contact resistance can be further reduced. Further, above the gates 23, there are formed no drain wiring 71a, 71b, 71c, and no source wiring 72a, 72b, 72c. Therefore, the distances at which the passing wire 30 faces the drain wiring and the source wiring can be reduced. Therefore, the coupling capacitance between the passing wire 30 and the drain wiring and the source wiring can be reduced.

What is claimed is:

1. A semiconductor device comprising:
    a transistor including
    a first diffusion layer formed on a main claim side portion of a semiconductor substrate;
    a second diffusion layer formed on the main surface side portion of the semiconductor substrate; and
    a gate for controlling a current between the first diffusion layer and the second diffusion layer; and
    a passing wire, disposed between a first wiring connected to the first diffusion layer via a first contact and a second wiring connected to the second diffusion layer via a second contact, insulated from the first diffusion layer, the second diffusion layer, and the gate.

2. The semiconductor device according to claim 1, wherein the first diffusion layer, the second diffusion layer, and the gates extend in one direction in a plane parallel to the main surface, and
    wherein the first wiring, the second wiring, and the passing wire extend in the other direction intersecting the one direction in the plane.

3. The semiconductor device according to claim 2, wherein the one direction is a widthwise direction of the transistor and the other direction is a gate length direction of the gate.

4. The semiconductor device according to claim 2, wherein the first contact is disposed at an intersection of the first diffusion layer and the first wiring, and
    wherein the second contact is disposed at an intersection of the second diffusion layer and the second wiring.

5. The semiconductor device according to claim 2, wherein a plurality of the first wirings are provided,
    wherein the plurality of the first wirings are connected to the first diffused layers of the same transistor, and
    wherein the second wirings are disposed between the plurality of the first wirings.

6. The semiconductor device according to claim 2, wherein a plurality of the second wirings are provided,
    wherein the plurality of the second wirings are connected to the second diffused layers of the same transistor, and
    wherein the first wirings are disposed between the plurality of the second wirings.

7. A semiconductor device according to claim 2, further comprising:
    a plurality of transistors adjoining in the other direction,
    wherein the first and second wirings are connected to the first and second diffusion layers of the plurality of transistors.

8. The semiconductor device according to claim 1, wherein the first wiring, the second wiring, and the passing wire belong to a first conductive layer counting from the main surface of the semiconductor substrate.

9. The semiconductor device according to claim 1, wherein the first wiring, the second wiring, and the passing wire are separated from the main surface of the semi-conductor board by substantially the same distances.

10. The semiconductor device according to claim 1, wherein the passing wire is connected to a module other than the module including the transistor, and
    wherein the operation voltage of the transistor differs from the operating voltage of the module to which the passing wire is connected.

11. The semiconductor device according to claim 1, wherein the first diffusion layer, the second diffusion layer, and the gates extend in one direction in a plane parallel to the major surface, and the passing wire extends in the other direction intersecting the one direction in the plane.

12. The semiconductor device according to claim 11, wherein a plurality of the first wirings are connected to the first diffusion layer,
    wherein a plurality of the second wirings are connected to the second diffusion layer, and wherein the passing wire is disposed between the plurality of the first wirings and between the plurality of the second wirings.

13. The semiconductor device according to claim 11, further comprising:
a third wiring connected to the first wiring via a third contact; and
a fourth wiring connected to the second wiring via a fourth contact,
wherein the third wiring and the fourth wiring extend in the one direction.

14. The semiconductor device according to claim 11, further comprising:
a plurality of transistors adjoining in said other direction.

15. A semiconductor device, comprising:
a flash module formed on a main surface of a semiconductor substrate; and
a soft macro module including a CPU formed on the main surface;
wherein the flash module includes
a power switch circuit for controlling ON and OFF of a power source used in the flash module; and
a control logic circuit for controlling a decoder of the flash module;
wherein the power switch circuit includes a transistor including
a first diffusion layer formed on a portion of the semiconductor substrate on the main surface side,
a second diffusion layer formed on the portion of the semiconductor substrate on the main surface side, and
a gate for controlling a current between the first diffusion layer and the second diffusion layer;
wherein a passing wiring connecting the control logic circuit and the soft macro module is disposed between a first wiring connected to the first diffusion layer via a first contact, and
wherein a second wiring connected to the second diffusion layer via a second contact, and is insulated from the first diffusion layer, the second diffusion layer, and the gate.

16. The semiconductor device according to claim 15,
wherein the first diffusion layer, the second diffusion layer, and the gates extend in one direction in a plane parallel to the main surface, and
wherein the first wiring, the second wiring, and the passing wire extend in the other direction intersecting with one direction in the plane.

17. The semiconductor device according to claim 15,
wherein the passing wire is connected to a soft macro module other than a module including the transistor, and
wherein the operation voltage of the transistor differs from the operating voltage of the soft macro module to which the passing wire is connected.

18. The semiconductor device according to claim 15,
wherein a plurality of the first wirings are provided,
wherein the plurality of the first wirings are connected to the first diffused layers of the same transistor, and
wherein the second wirings are disposed between the plurality of the first wirings.

19. The semiconductor device according to claim 15,
wherein the first diffusion layer, the second diffusion layer, and the gates extend in one direction in a plane parallel to the main surface,
wherein the first diffusion layer is connected to a plurality of the first wirings,
wherein the second diffusion layer is connected to a plurality of the second wirings,
wherein the passing wire extends in the other direction intersecting the one direction in the plane, and
wherein the passing wire is disposed between the plurality of the first wirings and between the plurality of the second wirings.

20. The semiconductor device according to claim 19, further comprising:
a third wiring connected to the first wiring via a third contact; and
a fourth wiring connected to the second wiring via a fourth contact, wherein the third wiring and the fourth wiring extend in the one direction.

* * * * *